United States Patent [19]

Dietze et al.

[11] 3,828,726

[45] Aug. 13, 1974

[54] FIXTURE FOR POSITIONING SEMICONDUCTOR DISCS IN A DIFFUSION FURNACE

[75] Inventors: Wolfgang Dietze, Munich; Konrad Reuschel, Groebenzell; Hans Stut, Vaterstetten, all of Germany

[73] Assignee: Siemens Aktiengesellschaft, Berlin and Munich, Germany

[22] Filed: June 12, 1972

[21] Appl. No.: 261,944

[30] Foreign Application Priority Data

July 7, 1971 Germany............................ 2133843

[52] U.S. Cl...................... 118/500, 211/41, 269/296

[51] Int. Cl............................................. B05c 11/14

[58] Field of Search........ 269/287, 296; 211/40, 41; 118/48–49.5, 500

[56] References Cited

UNITED STATES PATENTS

| | | | |
|---|---|---|---|
| 1,412,592 | 4/1922 | Allsop et al. | 211/41 X |
| 2,288,317 | 6/1942 | Greenberg | 211/40 |
| 3,151,006 | 9/1964 | Grabmaier et al. | 118/48 X |
| 3,480,151 | 11/1969 | Schmitt | 211/41 |
| 3,526,205 | 9/1970 | Rosenheinrich | 118/49 |
| 3,640,398 | 2/1972 | Loxley et al. | 211/41 |
| 3,678,893 | 7/1972 | Bell | 118/500 |
| 3,719,271 | 3/1973 | Authier et al. | 211/40 X |
| D199,504 | 11/1964 | Maiolatesi | 211/41 UX |

FOREIGN PATENTS OR APPLICATIONS

| | | | |
|---|---|---|---|
| 815,004 | 9/1951 | Germany | 211/40 |
| 1,532,497 | 6/1968 | France | 211/41 |

OTHER PUBLICATIONS

Marsh et al., "Wafer–Source Boat for Capsule Diffusion", IBM Tech. Disclosure Bulletin, pgs. 1446–1446a, Vol. 13, No. 6, November 1970.

*Primary Examiner*—Al Lawrence Smith
*Assistant Examiner*—K. J. Ramsey
*Attorney, Agent, or Firm*—Hill, Gross, Simpson, Van Santen, Steadman, Chiara & Simpson

[57] ABSTRACT

A fixture for positioning semiconductor discs in a diffusion furnace for diffusing doping material therein including a trough-shaped holder having sidewalls composed of a semiconductor material, the sidewalls having opposed grooves therein proportioned to receive individual semiconductor discs therein, the sidewalls being positioned to engage the peripheries of said discs along limited areas of contact which lie approximately at the horizontal plane including the center of gravity of the discs.

7 Claims, 5 Drawing Figures

FIXTURE FOR POSITIONING SEMICONDUCTOR DISCS IN A DIFFUSION FURNACE

BACKGROUND OF THE INVENTION

1. Field of the Invention

This invention is in the field of devices for positioning semiconductor discs in a diffusion furnace wherein the discs are supported in grooved walls with a minimum amount of contact with the walls, and wherein the discs are supported at their peripheries near their center of gravity so as to minimize the possibility of deformation at the high diffusion temperatures.

2. Description of the Prior Art

The diffusion of impurities into a semiconductor disc involves high temperatures. In the case of semiconductor discs made of silicon, the temperatures may range approximately from 1,050° to 1,250°C. In this temperature range, the semiconductor discs can be plastically deformed relatively easily. Plastic deformation may lead to disturbances in the crystal lattice which have adverse effects on the electrical characteristics of the semiconductor.

It has previously been proposed to position such discs during diffusion treatment into grooves provided in a plate. However, in such an arrangement the weight of the discs may exert a bending moment on the same, causing dislocations and disturbances in the crystal lattice.

SUMMARY OF THE INVENTION

The present invention provides different types of fixtures which can be used to support semiconductor discs in a diffusion furnace to minimize the possibility of having bending moments exerted during the high temperature diffusion treatment. In general, the devices of the present invention include a trough-like structure with sidewalls being formed with opposed grooves which are proportioned to receive individual discs. The grooves may be straight or curved, and are so arranged with respect to the disc that only very limited contact exists between the grooves and the disc, and such contact as exists occurs in the vicinity of the center of gravity of the disc so that the tendency to create bending moments is minimized.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which.

DESCRIPTION OF THE PREFERRED EMBODIMENTS

Figure 1:
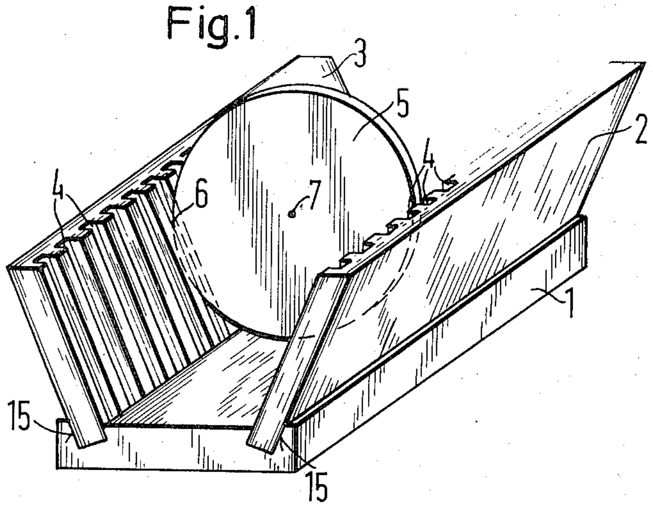
FIG. 1 is a view in perspective of a fixture which can be employed for the purposes of the present invention.

In FIG. 1, reference numeral 1 has been applied to a base plate of a trough-shaped holder which includes angularly disposed sidewalls 2 and 3. The sidewalls are received in suitable grooves 15 formed in the base plate 1. The base plate 1 and the sidewalls 2 and 3 are composed of the same semiconductor material as the material of the discs to be treated. The sidewalls 2 and 3 are provided with aligned grooves 4 which are proportioned to receive a thickness dimension of a semiconductor disc 5. For example, the grooves may have a depth of about 2 millimeters and a width of 0.8 millimeters. For purposes of clarity, only one semiconductor disc 5 has been shown within the spaced opposed grooves 4. It will be seen that the disc 5 is received in the grooves 4 so that it has opposed areas of contact at or slightly below the center of gravity 7 of the disc 5. The highest point on the disc at which it can be supported within the grooves is designated at reference numeral 6. Depending on the angular position of the sidewalls 2 and 3, the bottom of the disc 5 may be resting on the base plate 1 or even slightly elevated therefrom. The support of the discs 5 at or near their center of gravity minimizes the possibility of a bending moment being created upon application of high temperatures, which might cause dislocations and disturbances in the crystal lattice. The base plate 1 and the sidewalls 2 and 3 may be cut from a rod of silicon or the like. They may have a thickness of 5 millimeters or so and a length of 200 millimeters. The grooves 4 and the recesses 15 in the base plate 1 can be suitably milled from silicon or other semiconductor material.

Figure 2:
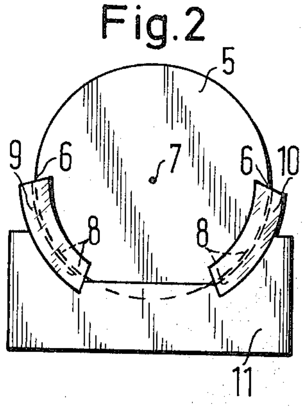
FIG. 2 is a front elevational view of a modified form of fixture.

In FIG. 2, corresponding reference numerals have been applied to the same elements as in FIG. 1. In this particular embodiment, the sidewalls of the trough-shaped holder are identified at reference numerals 9 and 10. The sidewalls 9 and 10 are shown as arcuate segments and are provided with inner grooves 8. The radius of curvature of the grooves 8 is substantially the same as the radius of curvature of the semiconductor discs 5. The discs 5 are thus supported with limited contact within the grooves 8, the highest point of support on the discs being again identified at reference numeral 6, this point corresponding approximately to the center of gravity 7 of the discs 5. Accordingly, a bending moment which might exert an influence on the discs is eliminated.

The sidewalls 9 and 10 are held together by means of a rigid support 11. It is not necessary that the support 11 be coextensive with the sidewalls as it is in the case of the base plate 1 of FIG. 1, and it is sufficient that the sidewalls 9 and 10 are held together by a pair of spaced support means arranged at the opposite ends of the sidewalls, the support means typically being about 10 millimeters thick. The grooves 8 may be milled by means of a circular saw from a tubular segment of semiconductor material. In the embodiment of the invention shown in FIG. 2, the centers of curvature of the sidewalls 9 and 10 are located inwardly of the sidewalls.

Figure 3:
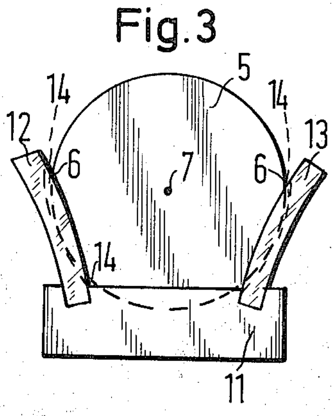
FIG. 3 is a front elevational view of a third form of the invention.

In the form of the invention shown in FIG. 3, we provide sidewalls 12 and 13 with opposed grooves 14, the grooves being curved along a radius of curvature at least as large as the radius of curvature of the disc 5, and the sidewalls 12 and 13 being curved outwardly away from each other.

Figure 4:
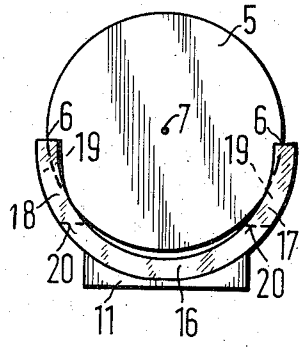
FIG. 4 is a front elevational view of a still further modified form of the invention.

In the embodiment shown in FIG. 4, a trough-shaped holder 16 may consist of a single piece of material. In this embodiment, the sidewalls have been designated at reference numerals 17 and 18. The sidewalls are provided with slots 19 which extend from the upper edge of the sidewalls to a plane designated at numeral 20. The holder can be produced from a single tube whose inner diameter is slightly smaller than the diameter of the semiconductor discs 5. The tube may be split parallel to its longitudinal axis. At the line of cutting, the slots 19 are milled or sawed in the interior wall of the tubular segment to the desired depth. It will be observed that the semiconductor disc is held at points labeled 6, marking the ends of the slots 19 with the bottom edge of the disc 5 out of contact with the base of the holder 16. The points 6 are situated approximately at the horizontal plane in which the center of gravity 7 is located. This again minimizes the tendency toward any bending moments existing during the high temperature treatment.

In FIGS. 1 to 4, inclusive, the planes of the semiconductor discs are located vertically and are perpendicular to the sidewalls in the holder. However, it is also possible to have the semiconductor discs 5 extending vertically and forming an angle smaller than 90°, such as 70° with the sidewalls. In this case, the slots and grooves have to be formed correspondingly. Changing the angular disposition of the sidewalls with respect to the discs can create more favorable flow conditions in the gas diffusion process.

The curved sidewalls 9, 10, 12 and 13 shown in FIGS. 2 and 3, as well as the holder shown in FIG. 4, should preferably be produced from a tube consisting of a semiconductor material. Such a tube can be produced by pyrolytic decomposition of a gaseous compound of a semiconductor material on a heated graphite rod. If the tube is to be made of silicon, a mixture of silicochloroform $SiHCl_3$ and hydrogen gas can be directed over the graphite member which is heated to a temperature of approximately 1,150°C. The silicochloroform reacts with hydrogen so that the crystalline silicon is deposited at the graphite member. When a sufficient thickness, for example, 5 millimeters, is reached, the carrier member is cooled and the silicon layer can then be removed from the graphite form. The sidewalls can then be produced by splitting the tube in the longitudinal direction.

Figure 5:
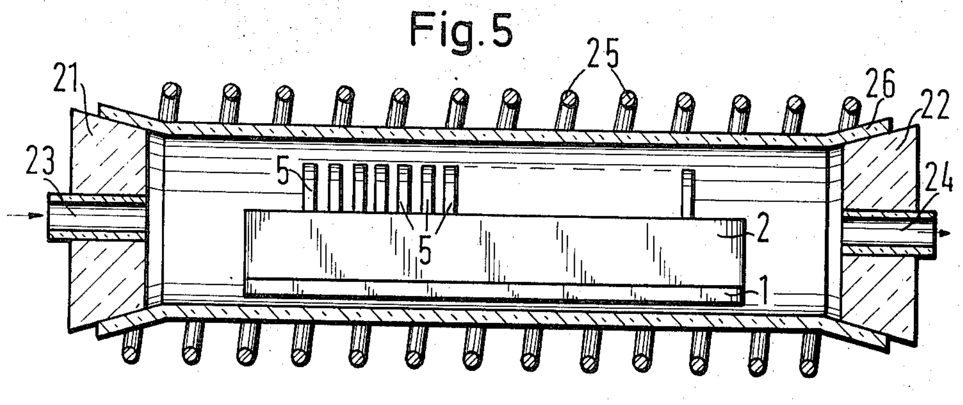
FIG. 5 is a longitudinal cross-sectional view of the manner in which a fixture according to the present invention is positioned in a diffusion furnace for diffusing impurities into the semiconductor discs.

In FIG. 5 there is illustrated a diffusion oven employing the type of fixture shown in FIG. 1 of the drawings. The oven consists of a refractory tube 26 which is closed off by means of end plugs 21 and 22. The plug 21 is provided with an inlet tube 23 and the plug 22 is provided with an outlet tube 24. The tube 26 is surrounded by a heating coil 25. The heating coil 25 may be used to heat the tube 26 by direct or high frequency induction currents. The tube 26 thereupon heats the semiconductor discs 5 by means of radiated heat. The diffusion may be carried out, for example, at a temperature of 1,220°C. for a period of about 24 hours.

While the invention has been described in terms of diffusing dopants into semiconductor discs made of silicon, it can also be used for the diffusion of semiconductor discs composed of germanium or other semiconductor materials such as Group 3-Group 5 compounds or Group 2-Group 6 compounds. The system can also be applied in the oxidation of semiconductor discs, since this type of process involves the same problems that occur in diffusion processes.

It should be evident that various modifications can be made to the described embodiments without departing from the scope of the present invention.

We claim as our invention:

1. A fixture for supporting semiconductor discs for the diffusion of doping material therein comprising a trough-shaped holder having sidewalls composed of a semiconductor material, said sidewalls having opposed groves therein proportioned to receive individual semiconductor discs in spaced relation therein, said sidewalls being positioned to engage the peripheries of said discs along limited areas of contact very substantially less than one-half the circumference of a disc, said areas being approximately at the horizontal plane including the center of gravity of said discs, and a base member having at least one recess therein receiving said sidewalls for supporting the same.

2. The fixture of claim 1 in which said grooves are curved along a radius of curvature approximating the radius of curvature of a disc, the centers of curvature of said grooves being inwardly of the sidewalls.

3. The fixture of claim 1 in which said grooves are curved along a radius of curvature at least as large as the radius of curvature of a disc, the sidewalls being curved outwardly away from each other.

4. The fixture of claim 2 in which said sidewalls consist of tubular segments.

5. The fixture of claim 1 in which said sidewalls are connected together by continuous support means coextensive with said sidewalls.

6. The fixture of claim 1 in which said sidewalls are formed in a tubular segment, and said grooves have inner diameters which are less than the diameter of a disc.

7. The fixture of claim 1 in which said sidewalls are composed of the same material as said semiconductor discs.

* * * * *